United States Patent
Lozano Villarreal

(10) Patent No.: US 9,044,898 B2
(45) Date of Patent: Jun. 2, 2015

(54) METHODS FOR JOINING ELECTRONIC DEVICE HOUSING STRUCTURES USING HEAT ACTIVATED THERMOSET FILM

(75) Inventor: Cesar Lozano Villarreal, Sunnyvale, CA (US)

(73) Assignee: Apple Inc., Cupertino, CA (US)

( * ) Notice: Subject to any disclaimer, the term of this patent is extended or adjusted under 35 U.S.C. 154(b) by 202 days.

(21) Appl. No.: 13/438,605

(22) Filed: Apr. 3, 2012

(65) Prior Publication Data

US 2013/0255875 A1    Oct. 3, 2013

(51) Int. Cl.
*B29C 65/18* (2006.01)
*H05K 13/08* (2006.01)
(Continued)

(52) U.S. Cl.
CPC ........... *B29C 65/20* (2013.01); *Y10T 156/1052* (2015.01); *B29C 66/11* (2013.01); *B29C 65/18* (2013.01); *H05K 5/0004* (2013.01); *H05K 13/08* (2013.01); *B29L 2031/3481* (2013.01); *B29C 65/16* (2013.01); *B29C 65/3444* (2013.01); *B29C 65/3468* (2013.01); *B29C 65/348* (2013.01); *B29C 65/4835* (2013.01); *B29C 65/5057* (2013.01); *B29C 66/1142* (2013.01); *B29C 66/1226* (2013.01); *B29C 66/12443* (2013.01); *B29C 66/12463* (2013.01); *B29C 66/54* (2013.01); *B29C 65/02* (2013.01); *B29C 66/1224* (2013.01); *B29C 66/91411* (2013.01);
(Continued)

(58) Field of Classification Search
CPC .............. B29C 65/1609; B29C 65/022; B29C 65/1648; B29C 65/1432; B29C 65/1445; B29C 65/18; B29C 35/0866; B29C 35/0805; B29C 66/11; B29C 66/742; B29C 66/1142; B29C 2793/0009; B29C 2793/0027; B29C 2793/0036; B29C 2793/0054; H05K 5/0004; H05K 5/003; H05K 5/0047; H05K 5/0052; H05K 13/08; H05K 13/0023; Y10T 56/1062
USPC ........... 156/158, 159, 157, 257, 273.3, 273.7, 156/275.5, 272.2, 275.1, 268, 304.3, 304.6, 156/307.7; 264/248, 447
See application file for complete search history.

(56) References Cited

U.S. PATENT DOCUMENTS 2,742,390 A * 4/1956 Beck ............................. 156/153
3,399,096 A * 8/1968 Ranger ......................... 156/202

(Continued)

FOREIGN PATENT DOCUMENTS

EP    0824270    2/2004
WO    2011060425   5/2011

*Primary Examiner* — Linda L Gray
(74) *Attorney, Agent, or Firm* — Treyz Law Group; G. Victor Treyz; Joseph F. Guihan

(57) ABSTRACT

An electronic device may have electronic components enclosed within a plastic housing. The plastic housing may include housing members that are joined using heat activated thermoset polymer film. The heat activated thermoset polymer film may be heated using a metal structure such as a strip of metal that is placed along a joint between the housing members. The temperature of the metal strip and associated layers of the thermoset polymer film may be raised by applying current to the metal strip using an external tool or the electronic components within the housing. Heat activated thermoset polymer film may be heated using a reactive multilayer metal foil. Heat sink layers of metal may be interposed between the reactive multilayer metal foil and the thermoset polymer film. A heated metal ring or a heated edge portion of a plastic housing member may also be used to heat the thermoset polymer film.

15 Claims, 11 Drawing Sheets

(51) Int. Cl.
  *B29C 65/20*   (2006.01)
  *B29C 65/34*   (2006.01)
  *B29C 65/48*   (2006.01)
  *B29C 65/50*   (2006.01)
  *B29C 65/00*   (2006.01)
  *H05K 5/00*   (2006.01)
  *B29L 31/34*   (2006.01)
  *B29C 65/16*   (2006.01)
  *B29C 65/02*   (2006.01)

(52) U.S. Cl.
  CPC ....... *B29C 65/3476* (2013.01); *B29C 66/91945* (2013.01); *B29C 66/91431* (2013.01); *B29C 66/91655* (2013.01); *B29C 66/919* (2013.01); *B29C 66/83221* (2013.01)

(56) References Cited

U.S. PATENT DOCUMENTS

| | | | | |
|---|---|---|---|---|
| 4,539,064 | A * | 9/1985 | Andruchiw et al. | 156/379.7 |
| 5,410,131 | A * | 4/1995 | Brunet et al. | 219/535 |
| 6,312,548 | B1 * | 11/2001 | Fathi et al. | 156/275.1 |
| 6,375,777 | B1 * | 4/2002 | Sjolin et al. | 156/209 |
| 7,531,122 | B2 * | 5/2009 | Weber et al. | 264/403 |
| 7,845,074 | B2 | 12/2010 | Motomura et al. | |
| 7,923,510 | B2 | 4/2011 | Husemann et al. | |
| 7,935,215 | B2 | 5/2011 | Husemann et al. | |

* cited by examiner dance with an embodiment of the present invention.

METHODS FOR JOINING ELECTRONIC DEVICE HOUSING STRUCTURES USING HEAT ACTIVATED THERMOSET FILM

BACKGROUND

This relates generally to electronic devices, and, more particularly, to assembling housing parts for an electronic device.

Electronic devices may include printed circuit boards and other internal components. These components may be mounted in a housing. With some devices, it may be desirable to form the housing from mating plastic housing structures.

Mating housing structures can be attached to each other using screws. However, screws may be unsightly. Other techniques may therefore be used that secure plastic housing structures without visible fasteners. For example, techniques for bonding plastic housing structures together such as ultrasonic welding, adhesive, and temperature bonding film may be used to avoid visible fasteners. These techniques may, however, pose manufacturing challenges. Ultrasonic welding can be used to join mating plastic parts, but may produce inconsistent results. Adhesives can be flammable. Temperature bonding film (TBF), which is a low melting temperature thermoplastic polymer, may become weakened when an electronic device is operated at elevated temperatures.

It would therefore be desirable to be able to provide improved ways in which to join plastic structures for electronic devices.

SUMMARY

An electronic device may have electronic components enclosed within a plastic housing. The electronic device may include a power converter circuit or other circuitry.

The plastic housing may include first and second mating housing members. The housing may be formed by joining edge portions of the first and second mating housing members.

The housing members may be joined using heat activated thermoset polymer film. Heat activated thermoset polymer material may be heated using a metal structure such as a strip of metal that is placed along the joint between the housing members. The temperature of the metal strip and associated layers of the heat activated thermoset film may be elevated by applying current to the metal strip using an external tool or by applying current to the metal strip using the electronic components within the housing. Heat activated thermoset polymer film may be heated using a reactive multilayer metal foil. Metal heat sink layers may be interposed between the reactive multilayer metal foil and the heat activated thermoset polymer film. A heated metal ring or a heated edge portion of a plastic housing member may also be used to heat the thermoset polymer film.

Further features of the invention, its nature and various advantages will be more apparent from the accompanying drawings and the following detailed description of the preferred embodiments.

DETAILED DESCRIPTION

Electronic devices may include polymer structures such as plastic housing structures. These structures may be joined using ultrasonic welding, adhesives, temperature bonding film (e.g., heat activated thermoplastic film), or heat activated thermoset film. Ultrasonic welding may leave visible artifacts along a joined seam. Adhesives may be flammable and therefore may be undesirable when used in products that operate at an elevated temperature. Thermoplastic polymers may become weakened when raised to an elevated temperature during operation of an electronic device.

To overcome these challenges, at least some of the polymer structures in an electronic device such as plastic housing structures may be joined using thermoset polymers. Thermoset polymers may be raised to an elevated temperature to allow the polymer material to soften and form a bond with other polymers. Unlike thermoplastic polymers, which can become soft if returned to an elevated temperature during use, thermoset polymers are generally heat resistant after they have been returned to room temperature following bonding. It may therefore be advantageous to use thermoset polymers such as heat activated thermoset films when forming bonds between respective plastic housing structures.

To form a polymer bond that attaches plastic housing portions to each other, heat activated thermoset polymer material can be raised to a temperature that is above the activation temperature of the thermoset polymer material (e.g., a temperature in the range of about 160-220° C.), while being sufficiently low to avoid damaging the plastic housing portions (i.e., by eliminating or at least minimizing heating of the plastic housing significantly above the glass transition temperature of the plastic housing and thereby avoiding visible damage to the plastic housing). To ensure that heat-induced artifacts such as plastic discoloration are not visible from the exterior of device 10, heat may be generated from within the joint that is formed where opposing edges of the plastic housing portions meet each other.

Figure 1:
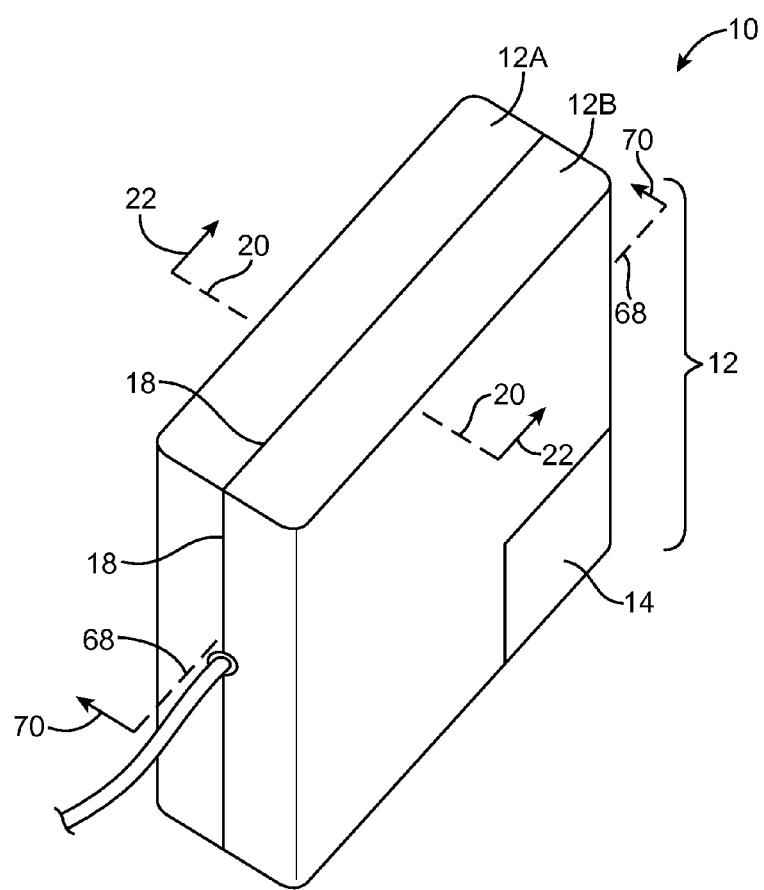
FIG. 1 is a perspective view of an illustrative electronic device of the type that may have multiple mating housing structures in accordance with an embodiment of the present invention.

An illustrative electronic device of the type that may have plastic structures that are joined using heat activated thermoplastic film is shown in FIG. 1. As shown in FIG. 1, electronic device 10 may have a housing such as housing 12. Housing 12 may have multiple structures such as housing member 12A and housing member 12B. Members 12A and 12B may be, for example, mating housing halves for a clamshell enclosure. If desired, more than two housing members may be attached to one another to form housing 12. The use of two opposing housing members such as housing members 12A and 12B of FIG. 1 is merely illustrative.

Device 10 may have a portion such as portion 14 that contains a plug configured to plug into an alternating current (AC) wall outlet. The interior of device 10 may contain alternating current to direct current (DC) power converter circuitry (AC/DC power converter circuitry) for converting AC power from the wall outlet into DC power. Cable 16 may be used to route DC power to an associated device such as a tablet computer, a laptop computer, a desktop computer, a cellular telephone, a media player, a display, a display that includes a computer, a television set-top box, a wireless router, a television, or other electronic equipment. If desired, device 10 may be a computer, telephone, media player, or other electronic equipment. The example of FIG. 1 is merely illustrative.

Figure 2:
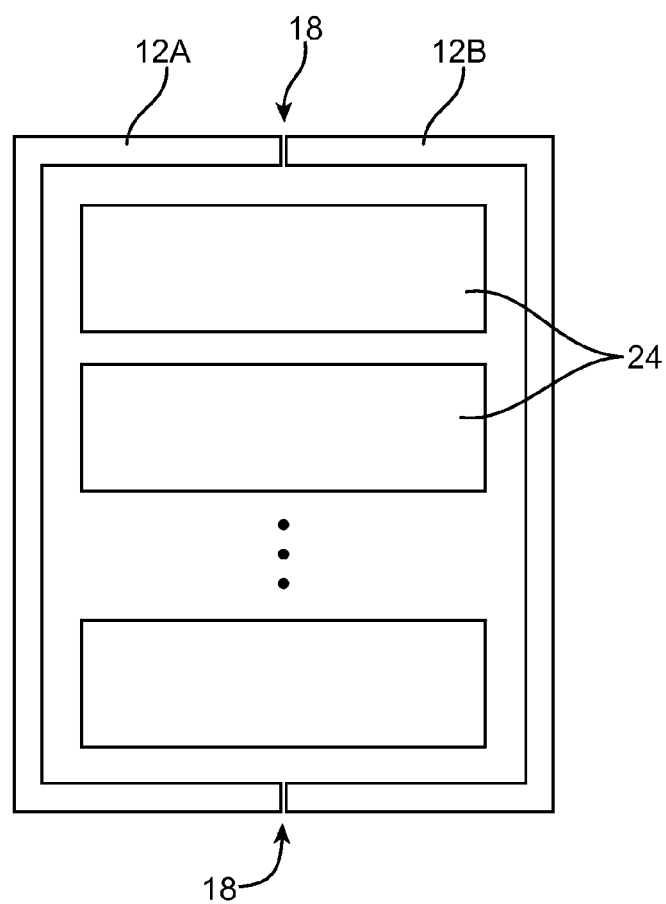
FIG. 2 is a cross-sectional view of the illustrative electronic device of FIG. 1 showing how the electronic device may have left and right housing members that are joined along a seam and that enclose internal device components in accordance with an embodiment of the present invention.

Housing members 12A and 12B may be joined along a seam such as joint 18 using a thermoset material such as a heat activated thermoset film. A cross-sectional side view of device 10 of FIG. 1 taken along line 20 and viewed in direction 22 is shown in FIG. 2. As shown in FIG. 2, housing members 12A and 12B may be joined along joint 18 to form a cavity that encloses internal components 24. Components 24 may include integrated circuits, discrete components such as resistors, inductors, and capacitors, switches, connectors, and other circuitry. The circuitry of components 24 may be used to perform functions such as alternating current (AC) to direct current (DC) power conversion (as an example). Components such as components 24 may be mounted on one or more substrates such as rigid printed circuit boards (e.g., fiberglass-filled epoxy boards), flexible printed circuits formed from sheets of polyimide or other flexible polymer layers, dielectric support structures such as structures formed from plastic, glass, ceramic, or other suitable substrate materials. Conductive traces (e.g., metal lines) may be used in interconnecting the circuitry of components 24.

Figure 3:
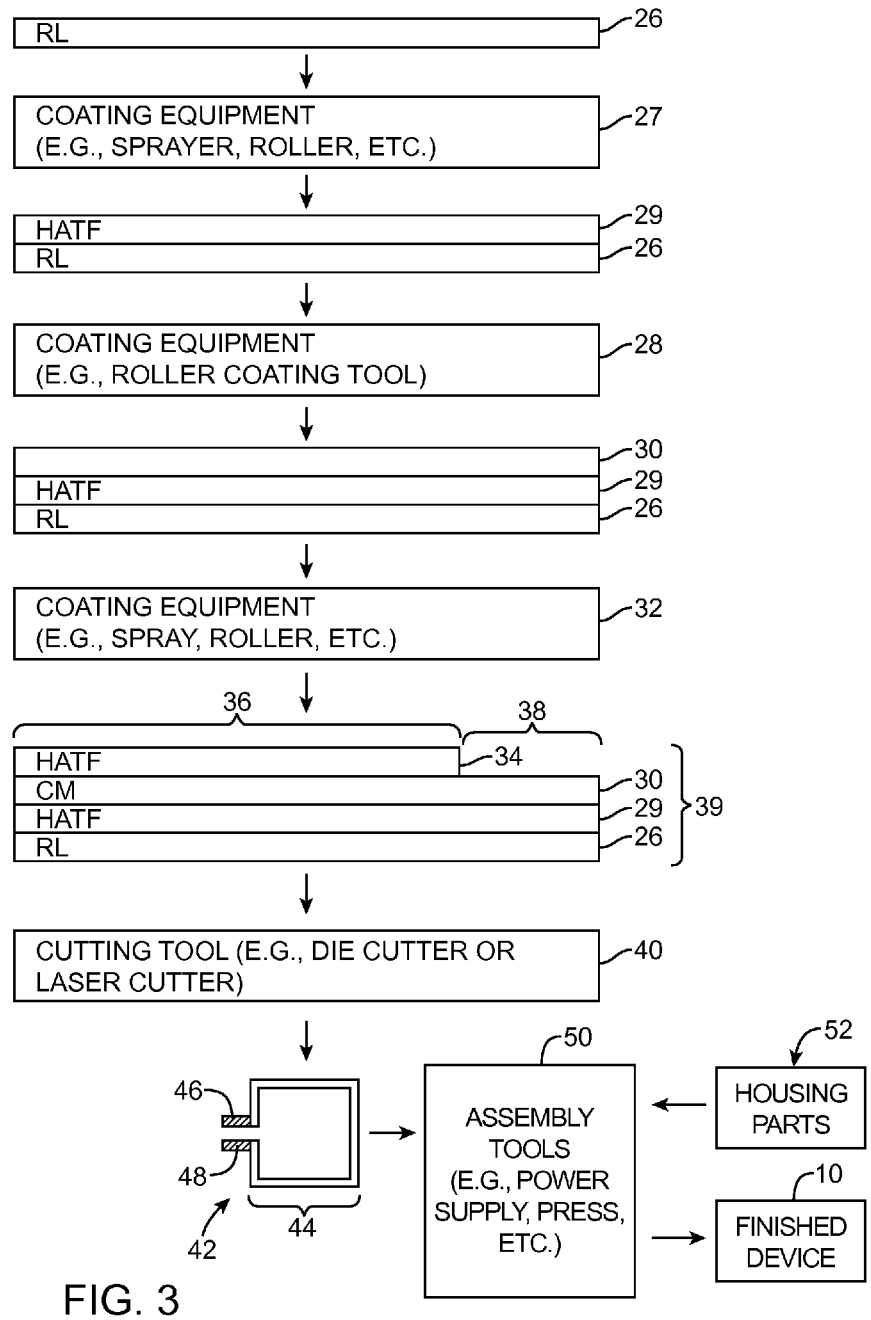
FIG. 3 is a diagram showing how housing structures of the type shown in FIGS. 1 and 2 may be joined with a heat activated thermoset film in accordance with an embodiment of the present invention.

A diagram showing equipment and operations involved in assembling electronic device 10 using heat activated thermoset film is shown in FIG. 3.

Initially, coating equipment 27 may be used to deposit a layer of material to form heat activated thermoset film 29 on release liner 26. Release liner 26 may be a sheet of release liner material such as a sheet of silicone or other polymer (e.g., polyamide, polyethylene terephthalate, polyethylene, polycarbonate, polymethylmethacrylate, etc.), paper, or other materials. Coating equipment 27 may, for example, receive a liquid precursor for film 29 and may contain spraying equipment, rolling equipment, or other equipment for depositing the liquid onto the surface of release liner 26. Heat treatment may be used to cure the deposited material to form film 29. Once cured, film 29 may be solid at room temperature.

Following formation of layer 29 on release liner 26, coating equipment 28 may be used to form conductive material layer 30 on layer 29. Coating equipment 28 may be a tool such as roller equipment for rolling a layer of conductive metal (e.g., conductive foil) onto the top of layer 29. If desired, coating equipment 28 may form other conductive materials (e.g., conductive polymers, metal silicides, etc.) on the surface of layer 29. The conductive material may be in sheet form (e.g., aluminum foil or copper foil) or may be a foil or structure that is used as a substrate for the heat activated thermoset film. The use of roller-based equipment to attach a sheet of metal to form conductive metal layer 30 is merely illustrative.

Following the formation of metal layer 30 on heat activated thermoset film 29, coating equipment 32 (e.g., equipment such as equipment 27) may be used to deposit and cure a layer of material to form heat activated thermoset film 34.

Films 34 and 29 may be characterized by an activation temperature of about 120° C. to 130° C. (or, if desired, about 100-150° C.). Housing members 12A and 12B may be formed from a polymer or other material that has the ability to remain solid at temperatures above the activation temperature of film 34 (e.g., housing members 12A and 12B may be characterized by a glass transition temperature above 150° C.). Housing members 12A and 12B may, as an example, be formed from a polymer such as polycarbonate (PC), acrylonitrile butadiene styrene (ABS), or a PC/ABS plastic blend.

During the process of forming film 34 on layer 30, film 34 may be patterned to form coated areas such as area 36 and uncoated areas such as uncoated area 38.

After forming layer 34 on layer 30 to form heat activated thermoset film structures 39, cutting tool 40 may be used to cut structures 39. Cutting tool 40 may, for example, include die cutting equipment such as a die press or laser cutting equipment such as computer-positioned laser cutting equipment that can pattern structures 39 to form a loop of heat activated thermoset film. Patterned heat activated thermoset film structures 42 may, for example, include a portion such as ring shaped (loop shaped) portion 44 in which layer 34 coats conductive layer 30 and may have a portion such as terminals 46 and 48 in which conductive layer 30 is uncoated by heat activated thermoset film 34.

Assembly tools 50 may be used to attach structures 42 to device housing structures 52 such as structures 12A and 12B. For example, tools 50 may include robotic positioning equipment or other equipment for placing loop 44 of heat activated thermoset film structures 42 face down on the edge of member 12A and peeling away release liner 26 so that layers 29, 30, and 34 remain in place on the edge of member 12A. In this configuration, the strip of material that makes up loop 44 runs along the edges of housing members 12A and 12B. Assembly tools 50 may include a press or other equipment for pressing and holding member 12B in position on mating housing member 12A (e.g., so that layers 29, 30, and 34 are held between opposing mating edges of members 12A and 12B along joint 18).

Assembly tools 50 may also include a power supply for contacting terminals 46 and 48 (e.g., power supply equipment that is external to housing 12). Once electrical contacts have been formed with terminals 46 and 48, the power supply may supply current through loop 44 of structures 42. Film 30 may be formed with a sufficiently small thickness T (e.g., 100 microns or less or 1 micron or less as examples) to allow film 30 to serve as an Ohmic heating element. As current passes through film 30 in loop 44 from the power supply, film 30 will heat due to Ohmic heating. This will cause adjacent heat activated thermoset films 29 and 34 in loop 44 to form a bond between member 12A and 12B along joint 18. Internal electrical components 24 may be sealed within the cavity formed by members 12A and 12B during the use of tools 50 to form finished electronic device 10.

If desired, heat may be applied using electromagnetic induction. With this type of arrangement, power supply 50 may include a radio-frequency signal generator that produces radio-frequency electromagnetic signals at a given frequency. Structure 44 may be implemented in the form of a metal loop, a metal strip, or other conductive structure that is configured to exhibit a resonance at the given frequency (i.e., a structure having a size and shape that exhibits an electromagnetic coupling resonance at the given frequency). When radio-frequency wireless signals are supplied by equipment 50 at the given frequency, the electromagnetically coupled structures will rise in temperature, thereby heating adjacent heat activated thermoset films 29 and 34.

Figure 4:
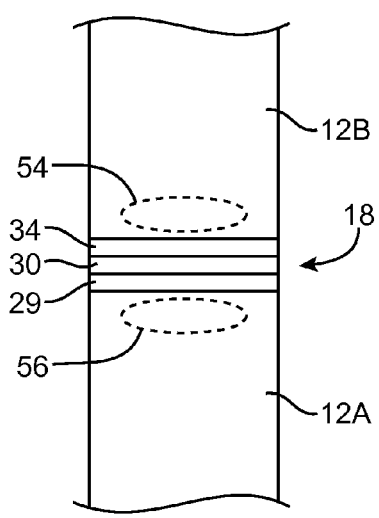
FIG. 4 is a cross-sectional side view of a joint between two opposing housing members before heating of a heating element to elevate the temperature of a heat activated thermoset film in accordance with an embodiment of the present invention.
Figure 5:
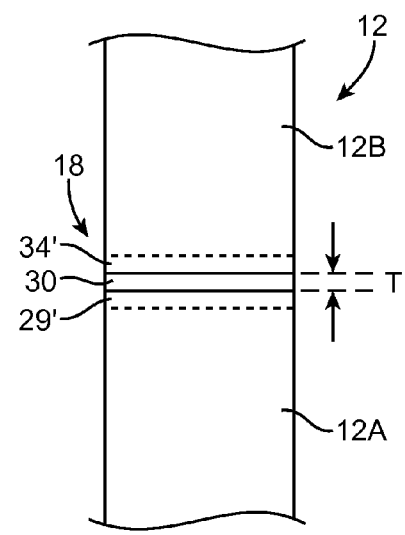
FIG. 5 is a cross-sectional side view of the joint between the two opposing housing members of FIG. 4 following heating of the heating element to elevate the temperature of the heat activated thermoset film in accordance with an embodiment of the present invention.

FIG. 4 is a cross-sectional view of joint 18 before application of heat to layers 29 and 34. As shown in FIG. 4, layers 29, 30, and 34 may form a strip of material that runs along joint 18. The strip of material that forms conductive layer 30 may serve as an Ohmic heating element. When current is applied to conductive strip 30, heat will flow to adjacent layers 29 and 34 of heat activated thermoset film. This will raise the temperature of the heat activated thermoset film above its activation temperature, while maintaining adjacent portions of members 12A and 12B such as portions 54 and 56 at temperatures below the glass transition temperature of the polymer material used to form members 12A and 12B. Elevation of the temperature of heat activated thermoset film 29 and 34 will cause the material of layers 29 and 34 to bond with members 12A and 12B and therefore securely join members 12A and 12B to each other along joint 18, as illustrated in FIG. 5. Dashed lines 34' and 29' in FIG. 5 show where heat activated thermoset material may bond with the material of members 12A and 12B. As shown in FIG. 5, conductive material 30 may remain in place within housing 12 following the joining of members 12A and 12B to each other.

Figure 6:
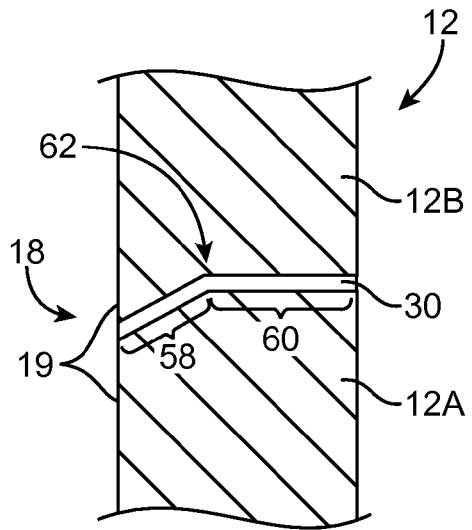
FIG. 6 is a cross-sectional side view of a joint between two opposing housing members showing how the joint may have an angled portion in accordance with an embodiment of the present invention.

As shown in FIG. 6, the opposing surfaces of members 12A and 12B that are associated with joint 18 need not be uniformly planar. For example, these surfaces may be configured so that joint 18 is characterized by a first planar portion such as portion 58 and a second planar portion such as portion 60. Portions 58 and 60 may be coupled at an angle (bent portion 62). As shown in the illustrative configuration of FIG. 7, members 12A and 12B may have interlocking engagement features. For example, member 12A may have a protruding portion such as protrusion 66 and member 12 may have a corresponding recessed portion such as recess 64. The surfaces that form engagement features 64 and 66 may have flat portions, curved portions, combinations of planar and non-planar surfaces, or other suitable shapes for interlocking members 12A and 12B. The configuration of FIG. 7 is merely illustrative.

Figure 7:
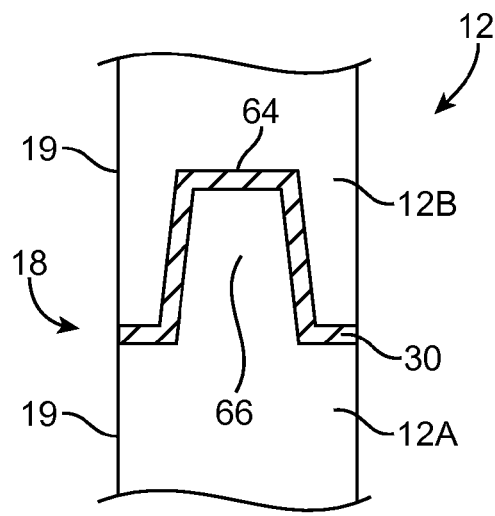
FIG. 7 is a cross-sectional side view of a joint between two opposing housing members showing how the edges of the housing members may have mating engagement features such as a protrusion and associated recess in accordance with an embodiment of the present invention.

During bonding of housing members 12A and 12B using thermoset films 29 and 34, exposed surfaces such as exterior cosmetic surfaces 19 of housing 12 in FIGS. 6 and 7 may remain visibly undamaged by avoiding or at least minimizing the application of heat to surfaces 19 (e.g., by applying heat through structure 30, etc., without using external tools to heat members 12A and 12B through surfaces 19).

Figure 8:
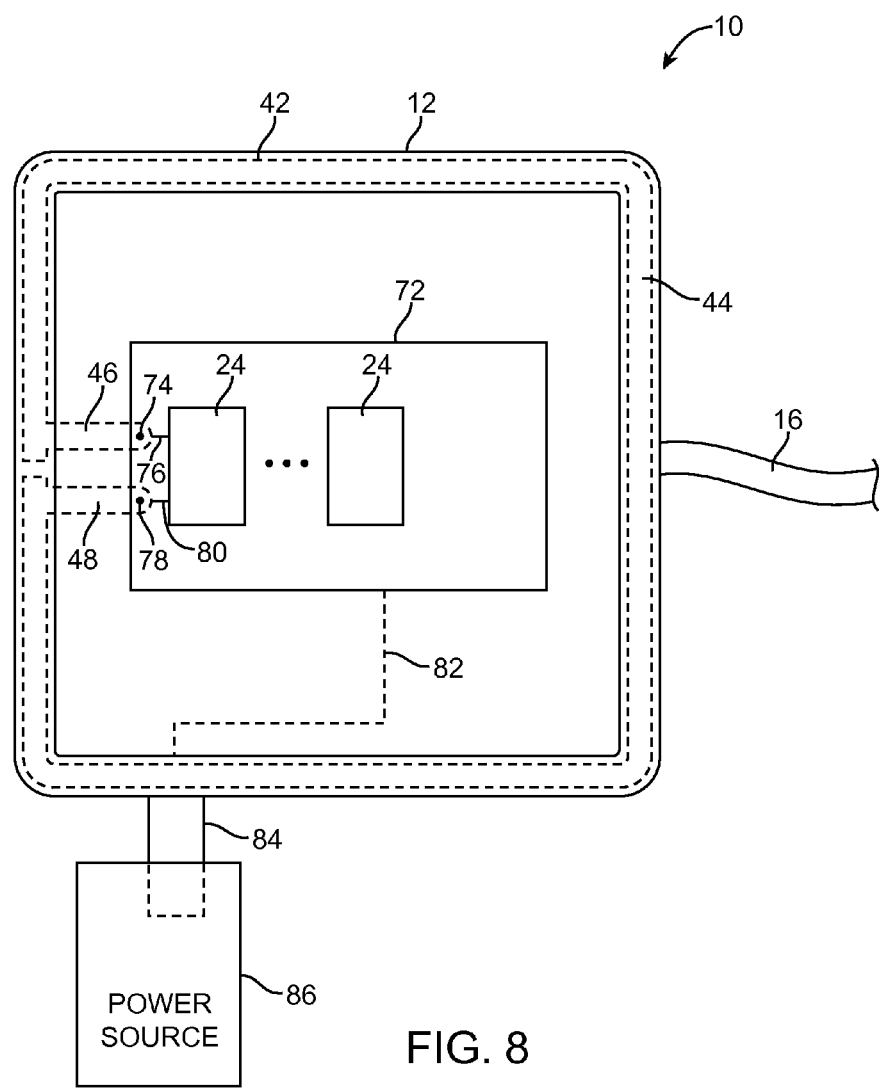
FIG. 8 is a cross-sectional view of the illustrative electronic device of FIG. 1 showing how internal device circuitry may be used in applying current to a heating element to elevate the temperature of heat activated thermoset film along the joint between first and second housing members in accordance with an embodiment of the present invention.

FIG. 8 is a cross-sectional view of device 10 of FIG. 1 taken along line 68 (i.e., along joint 18) and viewed in direction 70. As shown in FIG. 8, heat activated thermoset film structures 42 may be placed along the edge of the housing walls in housing 12 (e.g., along the opposing edges of members 12A and 12B). In this configuration, loop portion 44 of structures 42 may be used in joining members 12A and 12B together.

Current may be applied to layer 30 of structures 42 using external equipment such as tools 50 of FIG. 3 (e.g., using outwardly protruding terminals 46 and 48). As shown in the illustrative configuration of FIG. 8, terminals 46 and 48 may, if desired, be coupled to internal device circuitry. Internal components 24 such as integrated circuits, discrete components, and other circuitry may be mounted on a substrate such as substrate 72. Substrate 72 may be, for example, a printed circuit board. Device 10 may have an alternating current (AC) wall plug such as plug 84 that mates with a source of power such as a wall outlet (e.g., power source 86). Using paths such as path 82, power may be distributed from power source 86 to internal components 24.

Terminal 46 of heat activated thermoset structures 42 may be coupled to components 24 at node 74 using conductive paths such as path 76. Terminal 48 of heat activated thermoset structures 42 may be coupled to components 32 at node 78 using conductive paths such as path 80. Components 24 may be used to implement control circuitry for device 10. During manufacturing operations, the control circuitry can use power from source 86 to apply a current to structures 42. The current that flows through conductive layer 30 of structures 42 may elevate the temperature of layer 30 and the heat activated thermoset material in structures 42 sufficiently to activate the thermoset material and thereby attach members 12A and 12B along joint 18. Access to the functionality of circuitry 24 that permits Ohmic heating of layer 30 may be selectively enabled during manufacturing operations. Fro example, access to the ability to apply current to layer 30 may be secured using digital authentication, using software that is loaded and run on circuitry 24 only during manufacturing operations, or using other schemes to prevent inadvertent heating of layer 30 following manufacturing.

Figure 9:
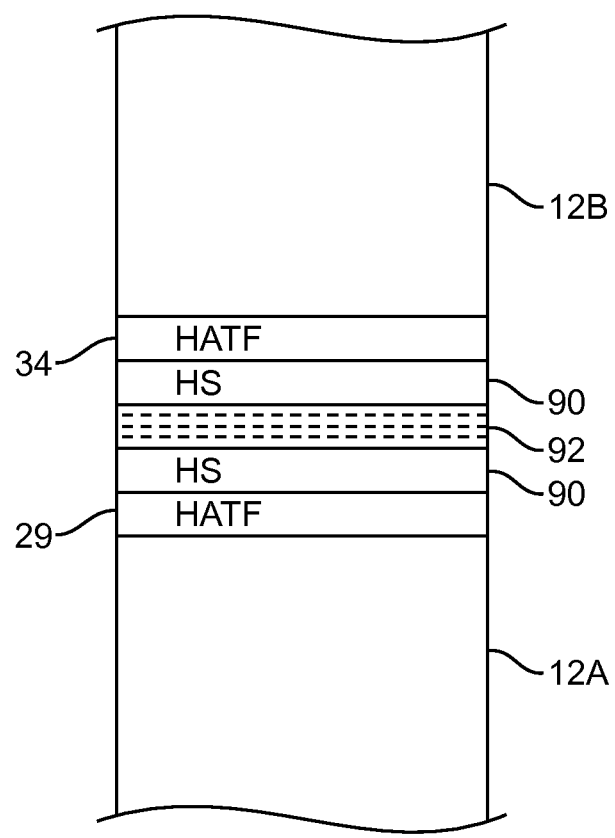
FIG. 9 is a cross-sectional view of a joint between opposing housing members showing how a reactive multilayer foil may be used to elevate the temperature of heat activated thermoset film along the joint in accordance with an embodiment of the present invention.

If desired, heat activated thermoset film layers 29 and 34 may be heated using a reactive multilayer foil such as foil 92 of FIG. 9. Foil 92 may include multiple layers of exothermically reacting materials such as alternating layers of metal. As an example, foil 92 may include alternating layers of aluminum and nickel or alternating layers of aluminum and titanium.

When it is desired to produce heat to form joint 18, an initiating electrical pulse may be applied to reactive multilayer foil 92. Once an exothermic reaction has been initiated in foil 92, the layers of foil 92 will react with each other and will produce heat. The heat from the foil may be used to elevate the temperature of heat activated thermoset film layers 29 and 34. If desired, optional layers such as layer 90 may be interposed between foil 92 and heat activated thermoset film layers 29 and 34. Layers 90 may be formed from a material such as metal or other materials that can serve as a heat sink for the heat generated by reactive multilayer foil structure 92. Use of this heat sink may help ensure that the heat generated by reactive multilayer foil structure 92 does not burn or otherwise damage heat activated thermoset film layers 29 and (i.e., the heat sink may help prevent an overly rapid rise in temperature and may help sustain an elevated temperature for an amount of time that is sufficient to activate heat activated thermoset film layers 29 and 34). As an example, reactive multilayer foil 92 may generate heat in a relatively short time period. Using heat sink layers 90, the heat that is generated by foil 92 may remain elevated above the activation temperature of heat activated thermoset film layers 29 and 34 for a more extended amount of time. If desired, a reactive process may be used that exhibits heat generation over other time periods (e.g., 1-500 ms, more than 50 ms, more than 500 ms, 0.1 to is or more, etc.). The structures of FIG. 9 such as heat activated thermoset film 29 and 34, heat sink layers 90, and reactive multilayer foil 92 may be formed in a ring shape or other suitable shape that runs along the opposing edges of housing members 12A and 12B to form joint 18.

Figure 10:
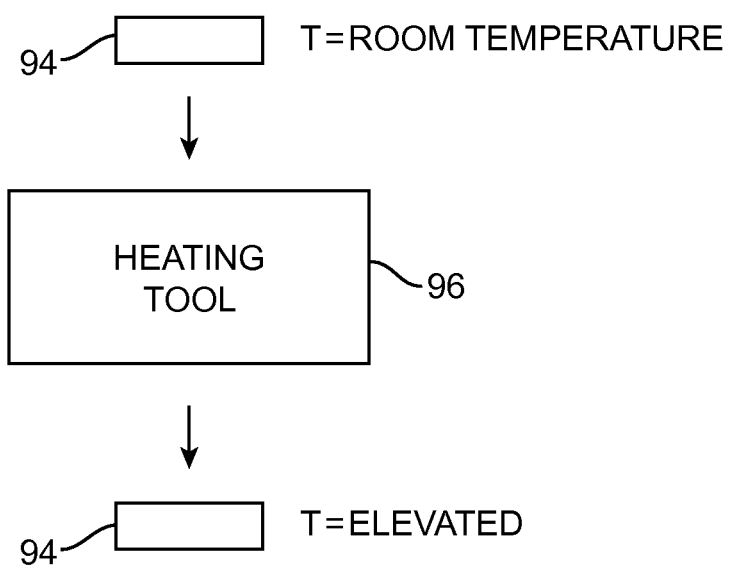
FIG. 10 is a cross-sectional diagram showing how a heat source may heat a ring of metal or other structure for use in elevating the temperature of heat activated thermoset film along a joint between opposing housing members in accordance with an embodiment of the present invention.

If desired, heat may be applied to heat activated thermoset film using a heated member such as a heated metal ring. This type of arrangement is shown in FIG. 10. As shown in FIG. 10, metal ring 94 may initially be at room temperature. Using heating tool 96, the temperature of metal ring 94 may be elevated (e.g., to a temperature above the activation temperature of heat activated thermoset film 29 and 34 and below the glass transition temperature of housing members 12A and 12B). Heating tool 96 may be, for example, an oven, a laser, a heated plate, or other heating equipment.

Figure 11:
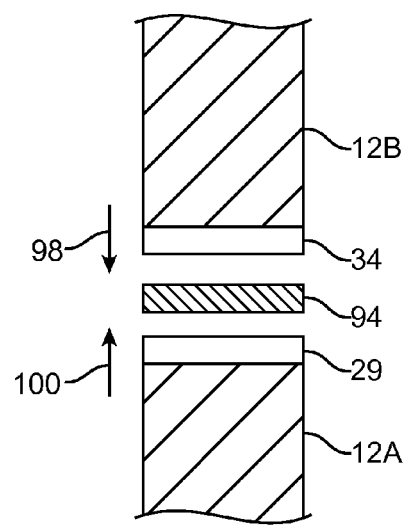
FIG. 11 is a cross-sectional side view of opposing housing members in the vicinity of a joint that has not yet been formed showing how a ring of metal or other structure that has been heated may be placed between layers of heat activated thermoset film for forming a bond along the joint in accordance with an embodiment of the present invention.
Figure 12:
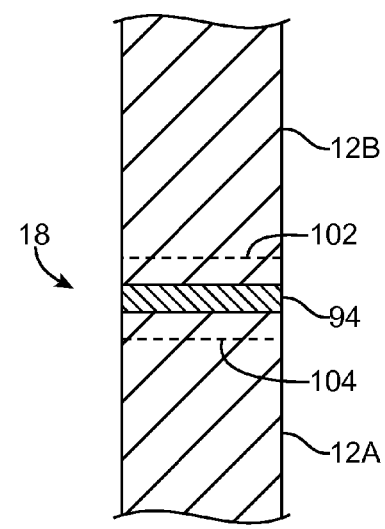
FIG. 12 is a cross-sectional side view of the opposing housing members of FIG. 11 after being attached to each other using heat activated thermoset film and a heated member such as a ring-shaped strip of metal in accordance with an embodiment of the present invention.

As shown in FIG. 11, heated metal structure 94 may be placed between opposing edges of members 12A and 12B with heat activated thermoset film layers 29 and 34. Members 12A and 12B may then be moved towards each other in directions 98 and 100. When heat activated thermoset film layers 29 and 34 contact heated metal ring 94, member 12A and member 12B may be attached to each other along joint 18, as shown in FIG. 12. The thermoset material of layers 34 and 29 may form attachment layers that attach metal ring 94 to members 12B and 12A, respectively, as shown by dashed lines 102 and 104.

Figure 13:
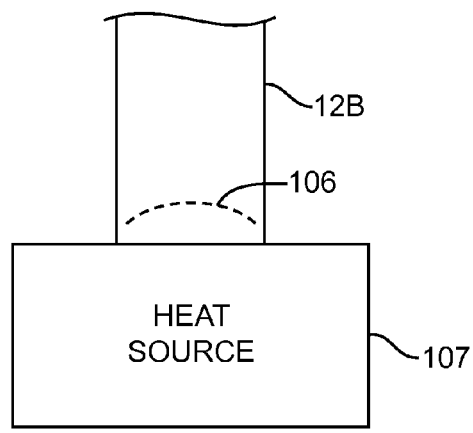
FIG. 13 is a cross-sectional side view of a housing member showing how an edge portion of the housing member may be raised to an elevated temperature using a heat source in accordance with an embodiment of the present invention.
Figure 14:
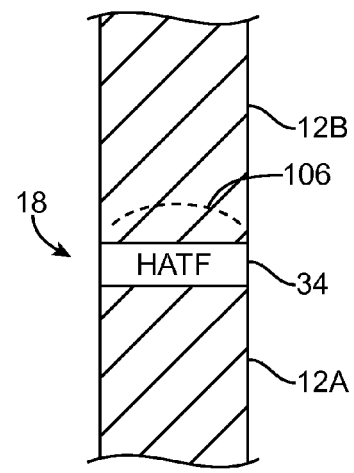
FIG. 14 is a cross-sectional side view of a pair of opposing housing members including the housing member of FIG. 13 showing how the elevated temperature of the housing member may be used to activate a heat activated thermoset film for attaching the housing members to each other in accordance with an embodiment of the present invention.

FIG. 13 shows how lower edge portion 106 of member 12B may be heated using heat source 107. Heat source 107 may be a laser, heated plate, or other heating source. When heated by heat source 107 as shown in FIG. 18, lower portion 106 of housing member 12B may be raised to a temperature that is below the glass transition temperature of the material that forms member 12 and that is above the activation temperature of heat activated thermoset film material. As shown in FIG. 14, members 12A and 12B may be pressed together to compress heat activated thermoset film 34 while region 106 is still at its elevated temperature. The heat from region 106 may then be transferred from region 106 to film 34, to form joint 18.

Figure 15:
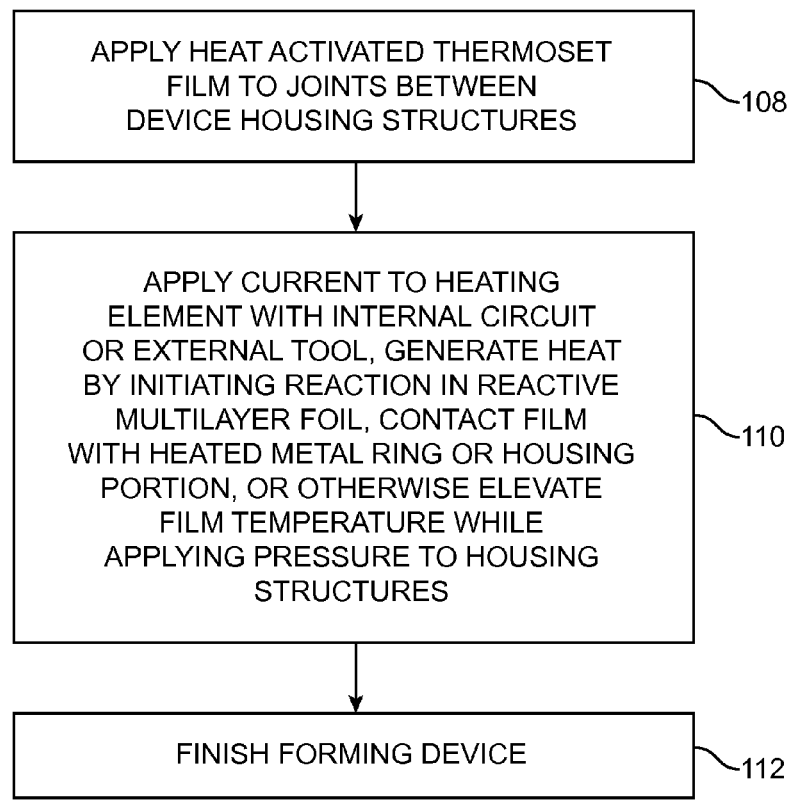
FIG. 15 is a flow chart of illustrative steps involved in attaching housing members to each other to form an electronic device housing or other electronic device structure in accordance with an embodiment of the present invention.

Illustrative steps involved in using heat activated thermoset films such as films 29 and 34 to join structures such as housing members 12A and 12B together are shown in FIG. 15.

At step 108, heat actuated thermoset film layers such as layers 29 and 34 may be assembled with other structures along the edges of members 12A and 12B that are to be joined. During the operations of step 108, material may be included in the region between members 12A and 12B to heat the heat actuated thermoset film layers. For example, a layer of metal such as metal 30 may be included to form an Ohmic heating element or a reactive metal foil and optional heat sinks may be included in configurations in which heat is to be generated using an exothermic reaction.

At step 110, heat may be applied to elevate the temperature of the heat activated thermoset film and thereby activate the heat activated thermoset film. When applying heat, internal electronic components 24 may be enclosed within the cavity formed inside mating electronic device housing members 12A and 12B. Heat may be applied to the heat activated thermoset film by applying current to an Ohmic heating element with an external tool, by using circuitry in the internal electrical components, by triggering an exothermic reaction in a reactive multilayer foil structure, by applying heat to the film from a heated metal ring, by heating a portion of members 12A and/or 12B using a heat source prior to pressing members 12A and 12B against the heat activated thermoset film, by applying electromagnetic energy (radio-frequency signals) wirelessly that are inductively coupled to a metal ring, strip, or other resonant structure (e.g., a structure such as structure 44 of FIG. 3 in a loop shape or other shape), or by using any other suitable heat application technique. These techniques may be used to apply heat internally within joint 18, rather than externally through the exterior walls of housing members 12A and 12B, thereby minimizing the potential for damage to the exposed surfaces of members 12A and 12B from excessive heat exposure.

At step 112, following formation of housing 12 for device 10 by joining housing members 12A and 12B along joint 18 using heat activated thermoset film, final device manufacturing operations may be performed (e.g., to trim excess material, to apply a desired surface finish, etc.).

The foregoing is merely illustrative of the principles of this invention and various modifications can be made by those skilled in the art without departing from the scope and spirit of the invention.

What is claimed is:

1. A method for joining plastic electronic device housing members, comprising:

forming structures that include heat activated thermoset film and a metal layer; and while the structures that include the heat activated thermoset film and the metal layer are interposed between the plastic electronic device housing members, applying current to the metal layer to raise the heat activated thermoset film to an elevated temperature, wherein the plastic electronic device housing members have edges that define a cavity, and wherein forming the structures comprises cutting the structures to form a loop that runs along at least some of the edges of the plastic electronic device housing members and surrounds the cavity.

2. The method defined in claim 1 wherein forming the structures comprises attaching a layer of heat activated thermoset film to the metal layer.

3. The method defined in claim 1 wherein cutting the structures comprises cutting the structures using a tool selected from the group consisting of: a laser and a die press.

4. A method for joining plastic electronic device housing members, comprising:
 forming structures that include heat activated thermoset film and a metal layer; and
 while the structures that include the heat activated thermoset film and the metal layer are interposed between the plastic electronic device housing members, applying current to the metal layer to raise the heat activated thermoset film to an elevated temperature, wherein forming the structures comprises forming the metal layer and a layer of heat activated thermoset film on a release liner.

5. The method defined in claim 2 wherein forming the structures comprises forming structures that include a metal layer interposed between first and second layers of heat activated thermoset film.

6. A method for joining plastic members, comprising:
 forming structures that include heat activated thermoset film and a metal layer; and
 while the structures that include the heat activated thermoset film and the metal layer are interposed between the plastic members, applying current to the metal layer to raise the heat activated thermoset film to an elevated temperature, wherein the plastic members comprise electronic device housing members, the method further comprising enclosing electronic components within the electronic device housing members while applying the current.

7. The method defined in claim 6 wherein applying the current comprises using an external tool to apply the current.

8. The method defined in claim 6 wherein applying the current comprises applying the current using circuitry in the electronic components that are enclosed within the electronic device housing members.

9. A method of attaching first and second plastic electronic device housing members, comprising:
 heating a metal structure to an elevated temperature; and
 while the metal structure is at the elevated temperature, compressing the metal structure and heat activated thermoset film between the first and second plastic electronic device housing members to form a joint that attaches the first and second plastic electronic device housing members, wherein the metal structure comprises a metal ring and wherein compressing the metal structure and heat activated thermoset film comprises compressing the metal ring between the first and second plastic electronic device housing members.

10. A method of attaching first and second plastic electronic device housing members, comprising:
 heating a metal structure to an elevated temperature; and
 while the metal structure is at the elevated temperature, compressing the metal structure and heat activated thermoset film between the first and second plastic electronic device housing members to form a joint that attaches the first and second plastic electronic device housing members, wherein compressing the metal structure and heat activated thermoset film between the first and second plastic electronic device housing members comprises enclosing internal electrical components within the first and second plastic electronic device housing members while compressing the metal structure and heat activated thermoset film between the first and second plastic electronic device housing members.

11. A method for forming an electronic device, comprising:
 placing structures that include heat activated thermoset polymer and a metal structure along a joint between first and second plastic electric device housing members; and
 attaching the first and second plastic electronic device housing members by applying current to the metal structure that raises the metal structure and the heat activated thermoset polymer to an elevated temperature, wherein attaching the first and second plastic electronic device housing members comprises enclosing electronic components within the first and second plastic housing members while applying the current to the metal structure.

12. The method defined in claim 11 further comprising:
 generating the current using the enclosed electronic components.

13. The method defined in claim 10 wherein the heat activated thermoset film is characterized by an activation temperature and wherein heating the metal structure comprises heating the metal structure to a temperature that is above the activation temperature and is insufficient to visibly damage the first and second plastic electronic device housing members.

14. The method defined in claim 11 wherein attaching the first and second plastic electronic device housing members comprises pressing the first and second plastic electronic device housing members together while applying the current to the metal structure.

15. The method defined in claim 9 wherein the heat activated thermoset film is characterized by an activation temperature and wherein heating the metal structure comprises heating the metal structure to a temperature that is above the activation temperature and is insufficient to visibly damage the first and second plastic electronic device housing members.

* * * * *